(12) United States Patent
Hishinuma et al.

(10) Patent No.: US 7,948,155 B2
(45) Date of Patent: May 24, 2011

(54) PIEZOELECTRIC DEVICE AND LIQUID-EJECTING HEAD

(75) Inventors: Yoshikazu Hishinuma, Kanagawa (JP); Fumihiko Mochizuki, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 314 days.

(21) Appl. No.: 12/232,983

(22) Filed: Sep. 26, 2008

(65) Prior Publication Data

US 2009/0085443 A1 Apr. 2, 2009

(30) Foreign Application Priority Data

Sep. 27, 2007 (JP) ................. 2007-250715

(51) Int. Cl.
*H01L 41/047* (2006.01)
(52) U.S. Cl. ...................... 310/363; 310/340
(58) Field of Classification Search .................. 310/340, 310/363
See application file for complete search history.

(56) References Cited

U.S. PATENT DOCUMENTS

| | | |
|---|---|---|
| 2003/0081080 A1 | 5/2003 | Moriya et al. |
| 2005/0046312 A1 | 3/2005 | Miyoshi |
| 2005/0052506 A1 | 3/2005 | Yagi et al. |
| 2005/0167854 A1 * | 8/2005 | Tikka et al. .................. 257/787 |
| 2007/0157442 A1 * | 7/2007 | Ha et al. ...................... 29/25.35 |
| 2008/0238261 A1 * | 10/2008 | Ohashi et al. ................. 310/340 |
| 2009/0072673 A1 * | 3/2009 | Fujii et al. .................... 310/358 |
| 2010/0125988 A1 | 5/2010 | Nakamura et al. |

FOREIGN PATENT DOCUMENTS

| | | |
|---|---|---|
| JP | 10-226071 A | 8/1998 |
| JP | 2003-291343 A | 10/2003 |
| WO | WO 2006/090618 A1 | 8/2006 |

OTHER PUBLICATIONS

Chinese Office Action dated Jul. 16, 2010 for Chinese Application No. 200810168097.1 (Partial English Translation).

* cited by examiner

*Primary Examiner* — Thomas M Dougherty
(74) *Attorney, Agent, or Firm* — Birch, Stewart, Kolasch & Birch, LLP

(57) ABSTRACT

The piezoelectric device includes a substrate, a first electrode deposited on the substrate, a piezoelectric film deposited on top of at least a part of the first electrode by vapor phase deposition, a second electrode deposited on the piezoelectric film and having a water vapor transmission rate of not more than 1 g/m$^2$/day, and at least one protective film that covers at least peripheries of the second electrode and the piezoelectric film and which has an opening in a position corresponding to the piezoelectric film except the periphery thereof. The piezoelectric device has satisfactory moisture resistance and is capable of effectively preventing the ingress of moisture into the piezoelectric film.

10 Claims, 4 Drawing Sheets

PIEZOELECTRIC DEVICE AND LIQUID-EJECTING HEAD

The entire contents of documents cited in this specification are incorporated herein by reference.

BACKGROUND OF THE INVENTION

The present invention relates to a piezoelectric device having a piezoelectric film deposited by vapor phase deposition, and a liquid-ejecting head that utilizes the piezoelectric device.

In recent years, active R&D efforts are being directed to various kinds of devices that use the piezoelectric element, as exemplified by actuators, sensors and memory devices, and piezoelectric films that are deposited by vapor phase deposition such as sputtering are drawing particular attention as functional films capable of high performance. Such piezoelectric films are typically used in the actuator section of inkjet heads, micropumps and so forth.

It is conventionally known that piezoelectric films in an applied electric field are vulnerable to high temperature and humidity and that they (the piezoelectric element) will deteriorate upon exposure to the moisture in the air. Specifically, the presence of water increases the leakage current, occasionally causing a dielectric breakdown in the piezoelectric film. In addition, the constituent elements in the piezoelectric film may react with the water to cause deterioration in the film. Various measures are taken to suppress the above-described dielectric breakdown or deterioration in piezoelectric films due to water.

For example, JP 2003-291343 A describes a liquid-propelling head comprising a channel-forming substrate that defines a pressure-generating compartment communicating with a nozzle opening through which a liquid is ejected and a piezoelectric device provided on one side of the channel-forming substrate, with a diaphragm being interposed, which comprises a lower electrode, a layer of piezoelectric element, and an upper electrode, characterized in that a sealing substrate having a piezoelectric device holding section that seals space as it is secured in a region that faces the piezoelectric device is provided on the side of the channel-forming substrate where the piezoelectric device is provided, and that at least a part of the periphery of the piezoelectric device holding section of the sealing substrate is joined to the channel-forming substrate via a glass joining layer made of glass.

In the liquid-propelling head described in JP 2003-291343 A, the sealing substrate is joined to the channel-forming substrate via the glass joining layer made of glass such that the piezoelectric device is sealed within the piezoelectric device holding section of the sealing substrate; the reference states that because of this design, no external moisture as in the atmosphere will get into the piezoelectric device holding section, whereby breakdown of the piezoelectric device due to moisture is prevented.

JP 10-226071 A describes an inkjet recording head including a piezoelectric oscillator comprising a lower electrode formed on a surface of an elastic plate that constitutes a pressure-generating compartment communicating with a nozzle opening, a layer of piezoelectric element formed on a surface of the lower electrode, and an upper electrode formed on a surface of the layer of piezoelectric element in a region that faces the pressure-generating compartment, wherein the upper electrode is formed independently in association with a region that faces the pressure-generating compartment and wherein an insulator layer that covers an area extending from the periphery of the upper surface of the upper electrode to the lateral sides of the layer of piezoelectric element is formed in such a way as to leave a window in at least an area that serves as a connection to an electrically conductive pattern. The inkjet recording head described in JP 10-226071 A prevents deterioration due to moisture absorption by covering the layer of piezoelectric element with the insulator layer.

JP 10-226071 A also describes forming a window in the insulator layer except in part of the periphery of the upper surface of the upper electrode, the window being larger than the area of connection between the upper electrode and the electrically conductive pattern and accounting for the most part of the displacement region of the layer of piezoelectric element. JP 10-226071 A states that in the disclosed inkjet recording head in which the above-mentioned window is formed in the most part of the region of the layer of piezoelectric element where it is displaced in an applied electric field, the piezoelectric element is displaced by a larger amount per unit voltage than when no such window is formed.

SUMMARY OF THE INVENTION

Piezoelectric actuators that utilize piezoelectric films having high piezoelectric constant that have been deposited by vapor phase deposition such as sputtering are particularly sensitive to the above-described problems due to water, i.e., the occurrence of leakage current, dielectric breakdown in the piezoelectric film due to the leakage current, and deterioration of the piezoelectric film due to the reaction the constituent elements in the piezoelectric film undergo with water.

For instance, sputtering can be used to prepare a piezoelectric film having a fine columnar structure. Since this piezoelectric film having a fine columnar structure features high orientation, it is preferred for its ability to provide high piezoelectric constant. When a high electric field is applied to this piezoelectric film having a fine columnar structure and high piezoelectric constant, gaps will form in the columnar structure to increase the chance of ingress of water molecules. This eventually promotes the deterioration of the piezoelectric film. An improvement of moisture resistance is therefore an important objective to attain for the purpose of improving the durability of piezoelectric devices fitted with highly functional piezoelectric films having high piezoelectric constant.

One may think of improving the moisture resistance of a piezoelectric device by depositing a protective film in such a way as to cover the piezoelectric film. Protective films, particularly ones having low water permeability, are often dense films. Since such dense protective films have high Young's modulus and residual stress, they inhibit the action of the actuator, causing the problem of considerably reducing its performance, as by preventing it from producing the amount of displacement or force it inherently has the ability to produce.

To deal with this problem, the liquid-propelling head described in JP 2003-291343 A attempts to protect the piezoelectric element against moisture by joining the sealing substrate to the channel-forming substrate and forming the piezoelectric element holding section to seal the piezoelectric element. This design, however, requires adjustment in the alignment between the sealing substrate and the channel-forming substrate, thus presenting the problems of complicating the manufacturing process and increasing the manufacturing costs. In addition, the piezoelectric element holding section and the sealing substrate that are provided to seal the piezoelectric element add to the overall thickness, which in turn increases the overall size of the liquid-propelling head.

According to the approach described in JP 10-226071 A, a window is formed in the insulator layer except in part of the periphery of the upper surface of the upper electrode, the window being larger than the area of connection between the upper electrode and the electrically conductive pattern and accounting for the most part of the displacement region of the layer of piezoelectric element and this effectively prevents the insulator layer from interfering with the displacement of the layer of piezoelectric element. In this design, the region other than the periphery of the upper surface of the layer of piezoelectric element and where no insulator layer is formed is designated the window; in this window region, the upper electrode formed on the layer of piezoelectric element is exposed to the outside of the device. According to JP 10-226071 A, this upper electrode is formed of a dense film of platinum or the like.

However, even when a dense film was formed of the illustrated platinum, the ingress of moisture through the upper electrode could not be adequately prevented; particularly in the case of a piezoelectric film having high piezoelectric constant that was deposited by vapor phase deposition such as sputtering, deterioration of the piezoelectric film due to moisture ingress was by no means negligible. JP 10-226071 A does not address any problem with the ingress of moisture from the upper electrode into the piezoelectric film.

The present invention has been accomplished with a view to solving the above-described problems of the prior art and has as an object thereof providing a piezoelectric device in which there is no need to form a sealing structure for accommodating a piezoelectric film within a sealed space in order to protect against moisture and which yet has satisfactory moisture resistance. Another object of the present invention is to provide a liquid-ejecting head that includes this piezoelectric device.

A particular object of the present invention is to provide a highly functional piezoelectric device having satisfactory moisture resistance that has a piezoelectric film as deposited by vapor phase deposition such as sputtering to have high piezoelectric constant and which yet is capable of effectively preventing the ingress of moisture into the piezoelectric film. Another specific object of the present invention is to provide a liquid-ejecting head that includes this piezoelectric device.

In order to achieve the above objects, a first aspect of the present invention provides a piezoelectric device comprising: a substrate; a first electrode deposited on the substrate; a piezoelectric film deposited on top of at least a part of the first electrode by vapor phase deposition; a second electrode that is deposited on the piezoelectric film and which has a water vapor transmission rate of not more than 1 $g/m^2/day$; and at least one protective film that covers at least peripheries of the second electrode and the piezoelectric film and which has an opening in a position that corresponds to the piezoelectric film except the periphery thereof.

The second electrode preferably contains at least one element selected from the group consisting of Ti, Ir, Ta, Pd, Ru, Rh, and Os.

The protective film preferably contains at least one member of the group consisting of SiN, $SiO_2$, SiON, $Al_2O_3$, $ZrO_2$, and diamond-like carbon.

The piezoelectric film is preferably deposited by sputtering.

A second aspect of the present invention provides a liquid-ejecting head comprising a piezoelectric device, the piezoelectric device including: a substrate; a first electrode deposited on the substrate; a piezoelectric film deposited on top of at least a part of the first electrode by vapor phase deposition; a second electrode that is deposited on the piezoelectric film and which has a water vapor transmission rate of not more than 1 $g/m^2/day$; and at least one protective film that covers at least peripheries of the second electrode and the piezoelectric film and which has an opening in a position that corresponds to the piezoelectric film except the periphery thereof.

According to the present invention, a second electrode having a water vapor transmission rate of not more than 1 $g/m^2/day$ is deposited on the piezoelectric film and, in addition, at least one protective layer is deposited to cover at least the peripheries of the second electrode and the piezoelectric film, the protective film having an opening in a position that corresponds to the piezoelectric film except its periphery; as a result, the ingress of moisture from the lateral sides of the second electrode and the piezoelectric film into the piezoelectric film can be prevented to provide a piezoelectric device having satisfactory moisture resistance, as well as a liquid-ejecting head including this piezoelectric device. In particular, there can be provided a highly functional piezoelectric device having satisfactory moisture resistance that has a piezoelectric film as deposited by vapor phase deposition such as sputtering to have high piezoelectric constant and which yet is capable of effectively preventing the ingress of moisture into the piezoelectric film, as well as a liquid-ejecting head that includes this piezoelectric device.

DETAILED DESCRIPTION OF THE INVENTION

Hereinafter, the piezoelectric device and the liquid-ejecting head that utilizes this piezoelectric device according to the present invention are described in detail with reference to the preferred embodiment shown in the accompanying drawings.

Figure 1:
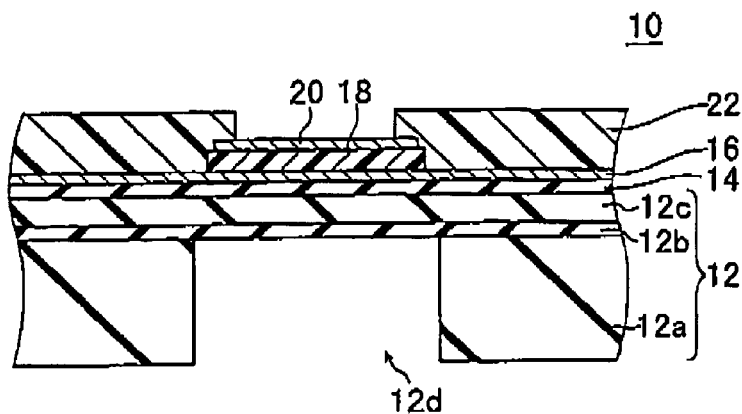
FIG. 1 is a sectional view showing schematically the piezoelectric device of the present invention.

FIG. 1 is a sectional view showing schematically a diaphragm-type piezoelectric actuator as one embodiment of the piezoelectric device according to the present invention (which is hereinafter referred to as a piezoelectric actuator). The piezoelectric actuator generally indicated by 10 in FIG. 1 comprises a SOI (silicon-on-insulator) substrate 12, a thermally oxidized film 14, a lower electrode 16, a piezoelectric film 18, an upper electrode 20, and a protective film 22.

It should be noted that the piezoelectric actuator 10 has various members, although not shown, that are necessary for driving it, as exemplified by a drive unit for controlling the voltage to be applied between the lower electrode 16 and the upper electrode 20 (i.e., the drive electric field to be applied to the piezoelectric film 18) and wiring for connecting each of the lower electrode 16 and the upper electrode 20 to the drive unit.

The SOI substrate 12 supports the lower electrode 16, piezoelectric film 18, upper electrode 20 and other components that are formed on top of it. The SOI substrate 12 consists of a support layer 12a which is a silicon substrate that has formed on it a silicon oxide ($SiO_2$) layer 12b and an active layer (an obverse silicon layer) 12c in that order.

An opening 12d is formed in a selected area of the support layer 12a. As will be described later, the capacity of the opening 12d will vary with a deformation of the piezoelectric film 18.

The thermally oxidized film 14 is formed over the active layer 12c.

In the embodiment under consideration, the SOI substrate is used for the substrate; however, this is not the sole case of the present invention and any kind of substrate may be employed as long as it satisfies the requirements that it should be capable of supporting the lower electrode 16, the piezoelectric film 18 and the upper electrode 20 that are formed on top it, that its thin-walled portion that corresponds to the opening 12d (and which corresponds to the area below the piezoelectric film 18 shown in FIG. 1) should be deformable as the piezoelectric film 18 is displaced, and that it should have sufficient mechanical durability to withstand repeated displacements of the piezoelectric film 18; examples that satisfy these requirements include SUS, SiC, Ge, GaAs, and quartz substrates.

The lower electrode 16 is deposited over the thermally oxidized film 14. The lower electrode 16 together with the upper electrode 20 applies a drive electric field that deforms the piezoelectric film 18.

The lower electrode 16 may be formed of any material that satisfies the requirements that it should have the necessary electrical conductivity as an electrode, that it should be deformable as the piezoelectric film 18 is displaced, and that it should have sufficient mechanical durability to withstand such deformation; for example, the lower electrode 16 may be formed of at least one metal selected from among Ti, Pt, Ir, Fe, Ru, and so forth.

The lower electrode 16 preferably has a thickness between 100 and 2000 nm.

A preferred mode of the lower electrode 16 may be one having a two-layer structure that comprises an adhesive layer that is provided to enhance the adhesion to the adjacent layer (the thermally oxidized layer 14 in the embodiment under consideration) and an electrically conductive layer. For example, the lower electrode 16 has a 10-nm thick Ti layer as the adhesive layer and a 200-nm thick Pt layer as the electrically conductive layer.

The piezoelectric film 18 is deposited in a partial region of the upper surface of the lower electrode 16 that corresponds to the opening 12d formed in the support layer 12a of the SOI substrate 12 by vapor phase deposition such as sputtering. By directly depositing the piezoelectric film 18 on top of the lower electrode 16 by vapor phase deposition such as sputtering, the highly functional piezoelectric film 18 having high piezoelectric constant can be deposited as it firmly adheres to the lower electrode 16.

The material, thickness, properties and other features of the piezoelectric film 18 may be appropriately chosen in such a way that it exhibits piezoelectric performance that is desired for use in the piezoelectric actuator. The thickness of the piezoelectric film 18 is not limited to any particular value but is preferably in the range from 0.1 to 30 μm.

The piezoelectric film 18 is typically a 10-μm thick film of lead zirconate titanate (PZT) that is directly deposited on top of the lower electrode 16.

Note that the piezoelectric film to be used in the present invention is not limited to the PZT film. The piezoelectric film may be composed of one or more perovskite-type oxides (which may contain incidental impurities) that are represented by the following general formula (P):

$$ABO_3 \quad (P)$$

where A is a site A element, or at least one element selected from the group consisting of Pb, Ba, La, Sr, Bi, Li, Na, Ca, Cd, Mg and K; B is a site B element, or at least one element selected from the group consisting of Ti, Zr, V, Nb, Ta, Cr, Mo, W, Mn, Sc, Co, Cu, In, Sn, Ga, Zn, Cd, Fe, Ni, and lanthanoids; O is oxygen; the standard case is where the number of moles of the site A element is 1.0, that of the site B element is 1.0, and that of oxygen is 3.0, provided that a departure from this standard for the numbers of moles of the site A element, the site B element and oxygen is tolerated within the range over which the perovskite structure can be realized.

Examples of the perovskite-type oxide that is represented by the general formula (P) include PZT and other lead-containing compounds such as lead titanate, lead zirconate, lead lanthanum titanate, lead lanthanum zirconate titanate, lead magnesium niobate zirconium titanate, lead nickel niobate zirconium titanate, and lead zinc niobate zirconium titanate, as well as mixed crystals thereof; and lead-free compounds such as barium titanate, strontium barium titanate, bismuth sodium titanate, bismuth potassium titanate, sodium niobate, potassium niobate, and lithium niobate, as well as mixed crystals thereof.

The upper electrode 20 is deposited on the piezoelectric film 18. The upper electrode 20 together with the lower electrode 16 applies a drive electric field to the piezoelectric film 18.

In the piezoelectric actuator 10 which is one embodiment of the piezoelectric device according to the present invention, the upper electrode 20 has high moisture resistance with a water vapor transmission rate of not more than 1 $g/m^2/day$ as determined by the Mocon method.

If the water vapor transmission rate of the upper electrode 20 exceeds 1 $g/m^2/day$, a more-than-allowable amount of water vapor will permeate the upper electrode 20 to reach the piezoelectric film 18 and the piezoelectric film having high dielectric constant that has been deposited by vapor phase deposition such as sputtering cannot be fully protected against deterioration and its durability life is typically several hours long and does not exceed several tens of hours at maximum.

By contrast, if the water vapor transmission rate of the upper electrode 20 is adjusted to 1 $g/m^2/day$ or less as in the present invention, permeation of water vapor through the upper electrode 20 can be effectively prevented and the piezoelectric film having a high dielectric constant that has been deposited by vapor phase deposition such as sputtering can be fully protected against possible deterioration by the permeation of water vapor through the upper electrode 20, with the result that its durability life is extended to several hundred hours or longer, which is satisfactory for practical applications. As a further advantage, the upper electrode having the above-characterized high moisture resistance eliminates the need to form a moisture-proof protective film on top of that upper electrode and this contributes to simplifying the constitution of the piezoelectric device.

In the present invention, water vapor transmission rate was measured in accordance with the above-mentioned Mocon method, specifically the method described in JIS K7129 under "Method B" (the infrared sensor method). The test conditions were 40° C. and 90% RH.

The upper electrode 20 may be formed of any material that satisfies the requirements that it should have the necessary electrical conductivity as an electrode, that it should have high moisture resistance, that it should be rigid but deformable as the piezoelectric film is displaced, and that it should have sufficient mechanical durability to withstand such deformation; for example, the upper electrode 20 may be formed of at least one metal selected from among Ti, Ir, Ta, Pd, Ru, Rh, Os, and so forth.

The thickness of the upper electrode 20 is not limited to any particular value and it may be determined depending upon the material to be used in such a way that it has the necessary electrical conductivity as an electrode and that it is rigid but does not prevent displacement of the piezoelectric film 18; for example, an upper electrode having a thickness of 100 to 1000 nm is preferably formed using one or more of the metals listed above as the material for the upper electrode 20.

If an upper electrode having a thickness of about 200 nm is deposited using one or more of the metals listed above as the material for the upper electrode 20, the resulting upper electrode 20 has a water vapor transmission rate of about 0.1 to 1 $g/m^2/day$.

A preferred mode of the upper electrode 20 is as in the case of the lower electrode 16 and it may be one having a two-layer structure that comprises an adhesive layer that is provided to enhance the adhesion to the adjacent layer (the piezoelectric layer 18 in the embodiment under consideration) and an electrically conductive layer. For example, the upper electrode 20 has a 10-nm thick Ti layer as the adhesive layer and a 200-nm thick Ir layer as the electrically conductive layer.

The protective film 22 is deposited on the periphery of the piezoelectric film 18, the periphery of the upper electrode 20 deposited on top of the piezoelectric film 18, and over substantially the whole surface of the lower electrode 16. The protective film 22 is a dense film formed by vapor phase deposition.

The protective film 22 may be any film that has satisfactory moisture resistance and examples include films of silicon nitride (SiN), silicon oxide ($SiO_2$), silicon oxynitride (SiON), aluminum oxide ($Al_2O_3$), zirconium oxide ($ZrO_2$), diamond-like carbon (DLC), and so forth. For example, the protective film 22 is a 500-nm thick silicon nitride film.

The piezoelectric actuator 10 having the above-described constitution is operated in the following manner: a voltage is applied between the lower electrode 16 and the upper electrode 20 to expand or contract the piezoelectric film 18, whereupon the silicon oxide layer 12b, the active layer 12c, the thermally oxidized film 14 and the lower electrode 16 working as a partition (diaphragm), all being positioned below the piezoelectric film 18, are deformed to change the capacity of the opening 12d formed in the support layer 12a. In other words, the capacity of the opening 12d changes as the piezoelectric film 18 is displaced.

The above-described diaphragm-type piezoelectric actuator is applicable to micropumps, ultrasonic transducers, inkjet heads (liquid-ejecting heads), and the like.

We next describe the process for producing the above-described piezoelectric actuator 10 by referring to FIGS. 2A to 3E. FIGS. 2A to 3E are process drawings showing the sequence of steps in the process for producing the piezoelectric actuator 10.

Figure 2A:
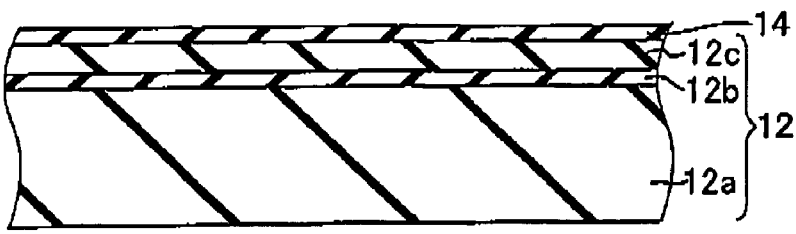
FIGS. 2A to 2E are process drawings showing a sequence of steps in the process for producing the piezoelectric device of the present invention.

First, a SOI substrate 12 is provided as shown in FIG. 2A. The SOI substrate 12 is placed in an electric oven and heat-treated, whereby the upper surface of the active layer 12c is oxidized to form a thermally oxidized film 14.

In a typical case, the active layer 12 has a thickness of 10 µm whereas the silicon oxide layer 12b and the thermally oxidized film 14 are 500 nm thick.

Figure 2B:
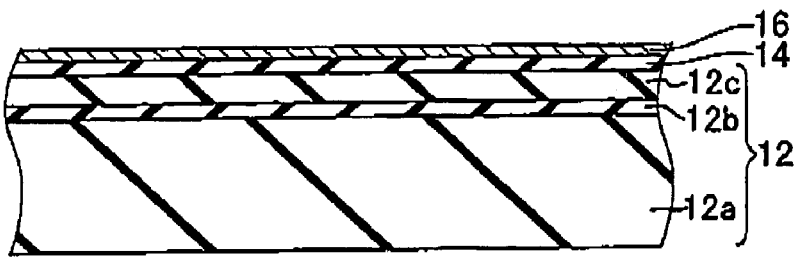

Then, a lower electrode 16 is deposited by sputtering as shown in FIG. 2B. In the embodiment under consideration, a 10-nm Ti layer is first deposited as an adhesive layer and thereafter a 200-nm Pt layer is deposited as an electrically conductive layer to thereby form the lower electrode 16 of a two-layer structure.

Note that the lower electrode 16 is not limited to a type of a two-layer structure. If desired, one of the metallic materials listed above may be chosen as a sputter target and sputtered to deposit a single metal layer; alternatively, three or more metal layers may be deposited.

Figure 2C:
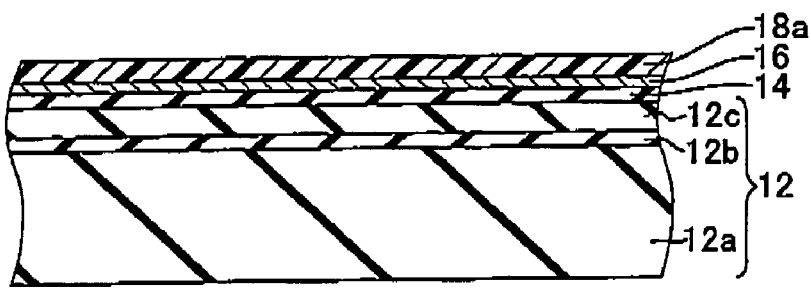

Subsequently, as shown in FIG. 2C, a yet to be patterned piezoelectric film 18a for forming the piezoelectric film 18 is deposited by vapor phase deposition such as sputtering or CVD. In the embodiment under consideration, a 10-µm PZT film is deposited as the piezoelectric film 18a by sputtering at 500° C. Note that the conditions for depositing the piezoelectric film by a variety of vapor phase deposition techniques such as sputtering may be those conditions under which highly functional piezoelectric films having high piezoelectric constant can be deposited.

Figure 2D:
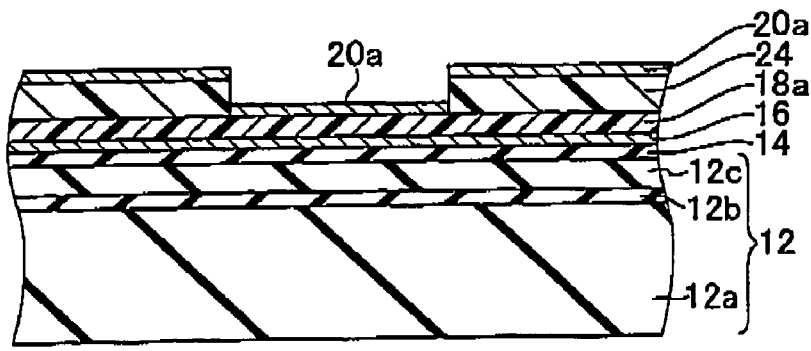

Subsequently, as shown in FIG. 2D, a resist pattern 24 for the upper electrode 20 is formed on the piezoelectric film 18a by photolithography and an upper electrode layer 20a is deposited by sputtering. In the embodiment under consideration, the upper electrode layer 20a consists of a 10-nm Ti layer that is first deposited as an adhesive layer and a 200-nm Ir layer which is then deposited as an electrically conductive layer having moisture resistance.

Figure 2E:
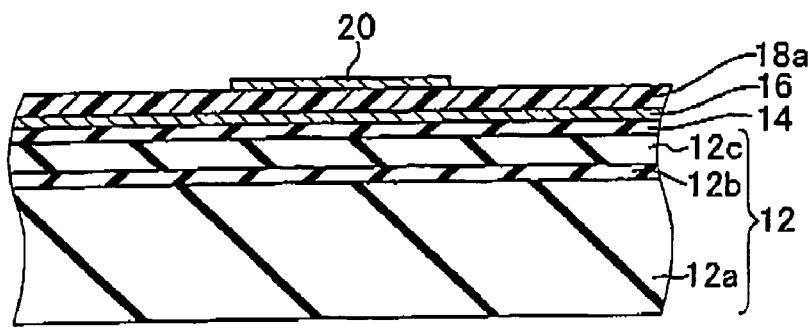

Subsequently, the resist pattern 24 is dissolved away in acetone to remove the upper electrode layer 20a formed on the resist pattern 24; by this lift-off technique, the upper electrode 20 is formed as shown in FIG. 2E. In this way, the upper electrode 20 that consists of two layers, the Ti and Ir layers, and which has a water vapor transmission rate of not more than 1 $g/m^2/day$ can be deposited on top of the piezoelectric film 18.

Note that the upper electrode 20 is not limited to the upper electrode layer 20a of a two-layer structure that has been formed by first depositing the Ti layer as an adhesive layer and thereafter depositing the Ir layer as an electrically conductive layer having moisture resistance. If desired, one of the materials listed above for the upper electrode 20 may be chosen as a sputter target and sputtered to deposit a single metal layer; alternatively, three or more metal layers may be deposited.

Figure 3A:
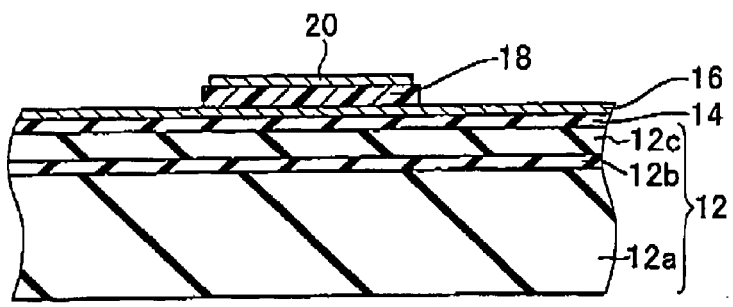
FIGS. 3A to 3E are process drawings showing a sequence of subsequent steps in the process for producing the piezoelectric device of the present invention.

Subsequently, a resist pattern for forming the piezoelectric film 18 is formed by photolithography on top of the piezoelectric film 18a, which is then dry etched; thereafter, the resist pattern is removed to provide the piezoelectric film 18 patterned to have a desired shape as shown in FIG. 3A.

Figure 3B:
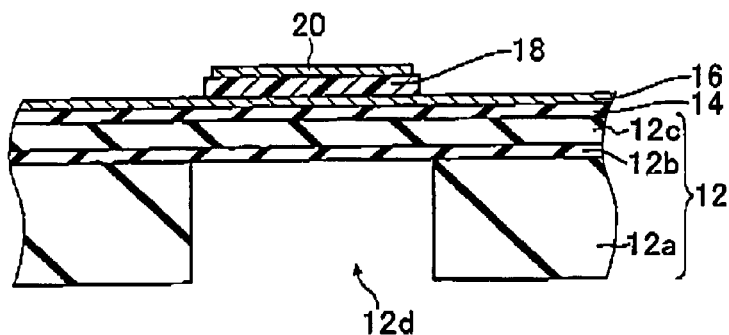

Subsequently, as shown in FIG. 3B, an opening 12d is formed in the support layer 12a of the SOI substrate 12 in a position that corresponds to the area where the piezoelectric film 18 is formed. To begin with, a resist pattern for forming the opening 12d is formed by photolithography over the support layer 12a, which is etched deep by an anisotropic dry etching technique such as the Bosch process until the silicon oxide layer 12b becomes exposed, whereby the opening 12d is formed; thereafter, the resist pattern is removed.

Figure 3C:
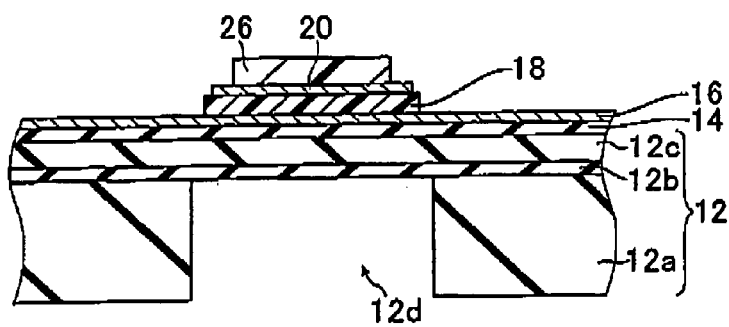

Subsequently, as shown in FIG. 3C, a resist pattern 26 for forming a protective film 22 is formed on top of the upper electrode 20 by photolithography using a highly heat-resistant resist. The resist pattern 26 is formed in such a way as to cover the entire region of the upper electrode 20 except its periphery.

Figure 3D:
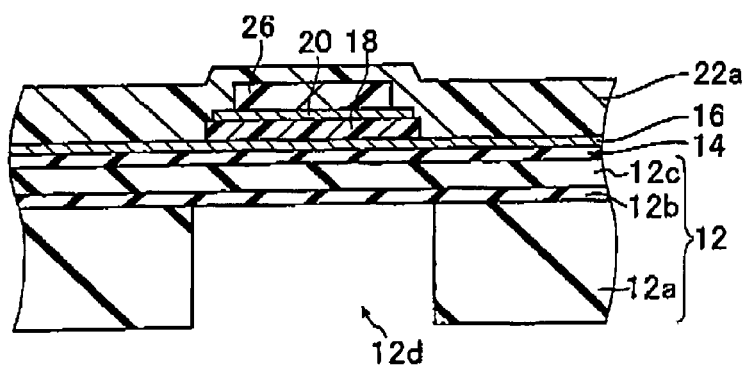

Subsequently, as shown in FIG. 3D, the protective film 22a is deposited over the lower electrode 16, the piezoelectric film 18, the upper electrode 20, and the resist pattern 26. In the embodiment under consideration, the protective film 22a may be deposited from SiN in a thickness of 500 nm by CVD at a deposition temperature of 250° C.

Figure 3E:
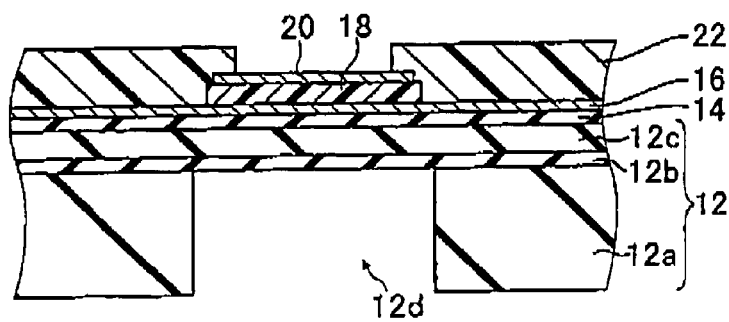

Subsequently, the resist pattern 26 is removed with the aid of a resist stripper to remove the protective film 22a formed over the resist pattern 26; by this lift-off technique, there is formed the protective film 22 which, as shown in FIG. 3E, has an opening in a region that corresponds to an area above the piezoelectric film 18 except the peripheries of the piezoelectric film 18 and the upper electrode 20.

In this way, the protective film 22 is formed on the periphery of the piezoelectric film 18, the periphery of the upper electrode 20 formed on top of the piezoelectric film 18, and over substantially the whole surface of the lower electrode 16.

By this procedure, the piezoelectric actuator 10 is formed as one embodiment of the present invention.

The upper electrode 20 deposited in the embodiment under consideration has a water vapor transmission rate of not more than 1 $g/m^2$/day as determined by the Mocon method; by ensuring that the upper electrode 20 has such high moisture resistance, permeation of moisture through the upper electrode 20 to reach the piezoelectric film 18 can be prevented to thereby prevent its deterioration due to the permeation of moisture.

A particularly noteworthy advantage is that even in the case of using a piezoelectric film having a high piezoelectric constant that has been deposited by sputtering as in the embodiment under consideration, the deterioration of the piezoelectric film due to the permeation of moisture can be effectively prevented.

In the embodiment under consideration, the protective film 22 is formed on the periphery of the piezoelectric film 18, the periphery of the upper electrode 20 formed on top of the piezoelectric film 18, and over substantially the whole surface of the lower electrode 16. In other words, the protective film 22 has an opening in a region that corresponds to an area above the piezoelectric film 18 except the peripheries of the piezoelectric film 18 and the upper electrode 20. Because of this design, when a voltage is applied to the piezoelectric film 18, the protective film 22 will by no means prevent a displacement of the piezoelectric film 18, which therefore can exhibit its inherent piezoelectric characteristics. As a further advantage, by designing the protective film 22 to have the above-described constitution, moisture can be prevented from permeating as through the lateral sides of the piezoelectric film 18 or through the junction with the lower electrode 16.

Furthermore, by depositing the upper electrode 20 whose water vapor transmission rate is not more than 1 $g/m^2$/day as described above, and also by patterning the protective film 22 in such a shape that it has an opening in a region that corresponds to an area above the piezoelectric film 18 except the peripheries of the piezoelectric film 18 and the upper electrode 20, a highly functional piezoelectric device can be realized that exhibits the inherent piezoelectric characteristics of the piezoelectric film and which yet has high moisture barrier properties.

In the embodiment under consideration, the protective film 22 is formed on the periphery of the piezoelectric film 18, the periphery of the upper electrode 20 formed on top of the piezoelectric film 18, and over substantially the whole surface of the lower electrode 16, but the present invention is not limited to this, provided that the protective film 22 has such a shape that it covers at least the peripheries of the piezoelectric film 18 and the upper electrode 20.

In the embodiment under consideration, the protective film 22 consists of a single layer but this is not the sole case of the present invention and the protective film 22 may be formed of two or more layers, which contributes to forming a denser film. For instance, even if tiny defects such as cracks develop in the first layer of the protective film, the second layer of the protective film can repair such defects and the protective film remains sufficiently dense to feature high insulating and moisture resisting properties.

As noted above, in the embodiment under consideration, the protective film 22 is deposited to cover the peripheries of the piezoelectric film 18 and the upper electrode 20 and it has an opening in a region that corresponds to an area above the piezoelectric film 18; therefore, even if a plurality of layers are deposited to form the protective film, the latter will not prevent the piezoelectric film 18 from being displaced. In other words, by designing the protective film to have the above-described constitution, more than one protective layer can be deposited while permitting the piezoelectric film to maintain its inherent piezoelectric characteristics and, as described above, the protective film formed is sufficiently dense to feature high insulating and moisture resisting properties.

Figure 4:
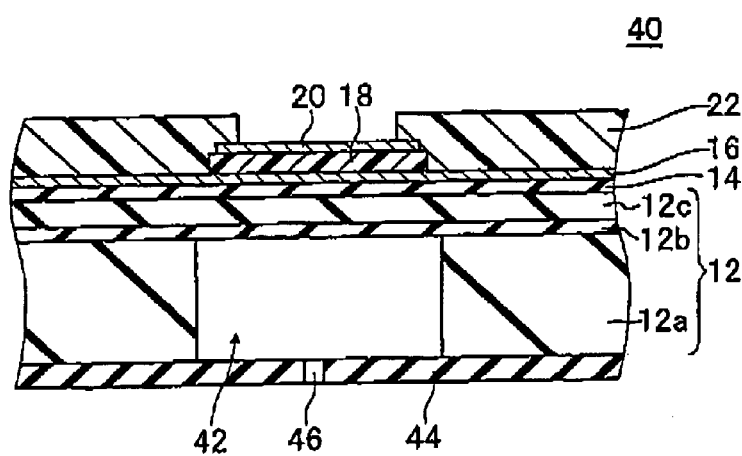
FIG. 4 is a sectional view showing an inkjet head using the piezoelectric device of the present invention.

The following description concerns an inkjet head which is one embodiment of the liquid-ejecting head that includes the piezoelectric device of the present invention. FIG. 4 is a sectional view showing schematically one ejecting portion 40 which is part of the inkjet head. One ejecting portion 40 is the same as the diaphragm-type piezoelectric actuator 10 shown in FIG. 1, except that a nozzle plate 44 having a nozzle 46 is fitted to the support layer 12a.

Turning back to FIG. 1, the opening 12d in the piezoelectric actuator 10 works as a pressure compartment 42 in the ejecting portion 40 of the inkjet head according to the embodiment under consideration. The inkjet head also has an ink supply channel which is not shown. Ink is supplied to the pressure compartment 42 via the ink supply channel.

The inkjet head comprises an array of ejecting portions 40. The direction in which the ejecting portions 40 are arranged in the inkjet head is not particularly limited. In the inkjet head, the ejecting portions 40 may be arranged in a single direction or they may be arranged two-dimensionally.

Each ejecting portion 40 is operated in the following manner: a voltage is applied between the lower electrode 16 and the upper electrode 20 to expand or contract the piezoelectric film 18, whereupon the silicon oxide layer 12b, the active layer 12c, the thermally oxidized film 14 and the lower electrode 16 working as a partition (diaphragm), all being positioned below the piezoelectric film 18, are deformed to change the capacity of the pressure compartment 42d. If a voltage is applied to the piezoelectric film 18 in such a direction that the diaphragm is displaced downward, the capacity of the pressure compartment 42 decreases to eject an ink droplet through the nozzle 46.

While the piezoelectric device and the liquid-ejecting head that utilizes this piezoelectric device according to the present invention have been described above in detail, the present invention is by no means limited to the embodiment described above and it should of course be understood that various improvements and alterations are possible without departing from the spirit and scope of the present invention.

EXAMPLES

Example 1

Figure 5:
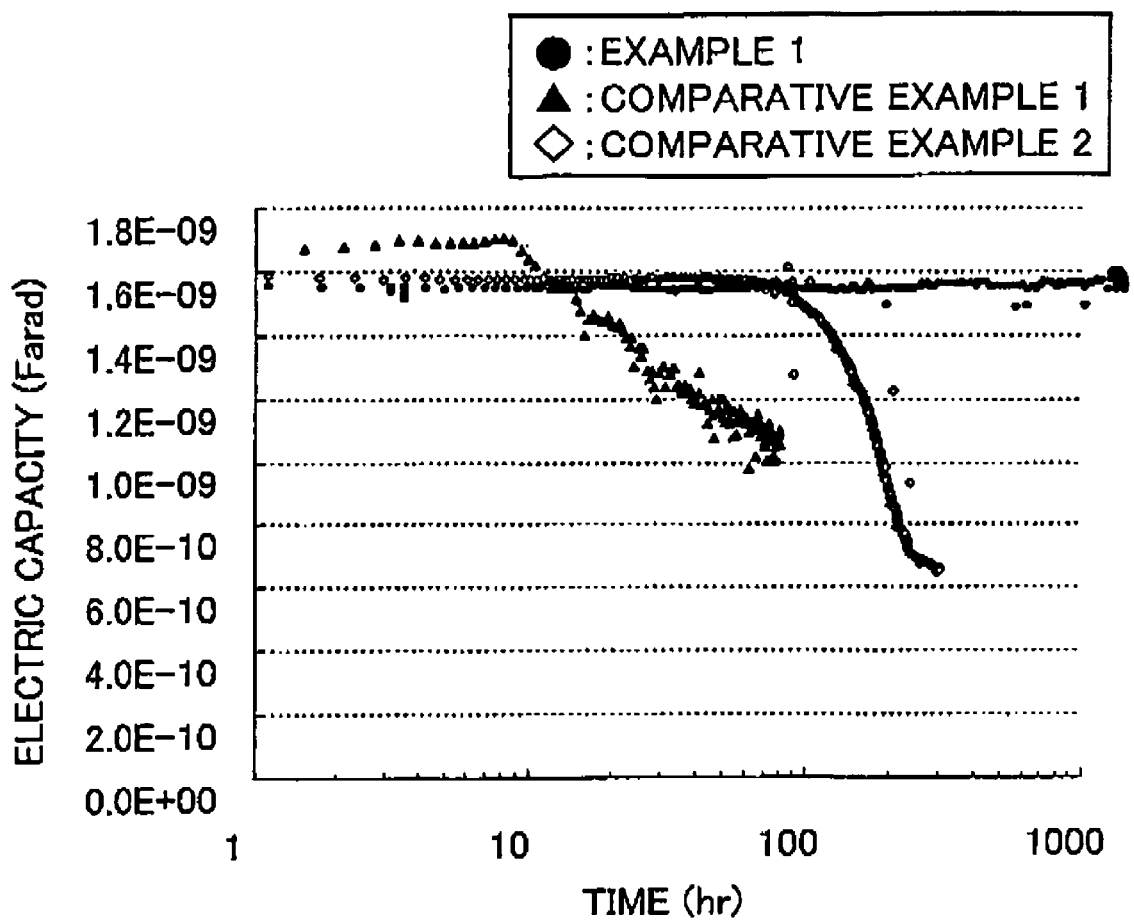
FIG. 5 is a graph showing the results of a durability test performed on three samples of piezoelectric device.

A piezoelectric actuator of the type indicated by 10 in FIG. 1 was fabricated by the production process depicted in FIGS. 2A to 3E. The thus fabricated piezoelectric actuator 10 was subjected to a durability test for evaluating its moisture resistance. The results of the durability test are shown in FIG. 5.

The piezoelectric actuator 10 as the test sample had the upper electrode 20 composed of a 10-nm thick Ti layer (adhesive layer) and a 200-nm thick Ir layer (electrically conductive layer). The upper electrode 20 including the 200-nm thick Ir layer had a water vapor transmission rate of 0.1 $g/m^2/day$. Thus, the test sample satisfied the requirement of the present invention that the water vapor transmission rate of the upper electrode should be not more than 1 $g/m^2/day$. The piezoelectric actuator under test also had a 500-nm thick SiN film as a protective film.

The piezoelectric actuator of Example 1 was placed in a humid atmosphere (80% RH) at 40° C. while a voltage of rectangular waveform at 0-30 volts and 50 kHz was applied as a drive voltage between the upper and lower electrodes, and the time-dependent change in the electric capacity between the upper and lower electrodes was measured. The result is shown in FIG. 5 with the label of "Example 1."

Comparative Example 1

Figure 6:
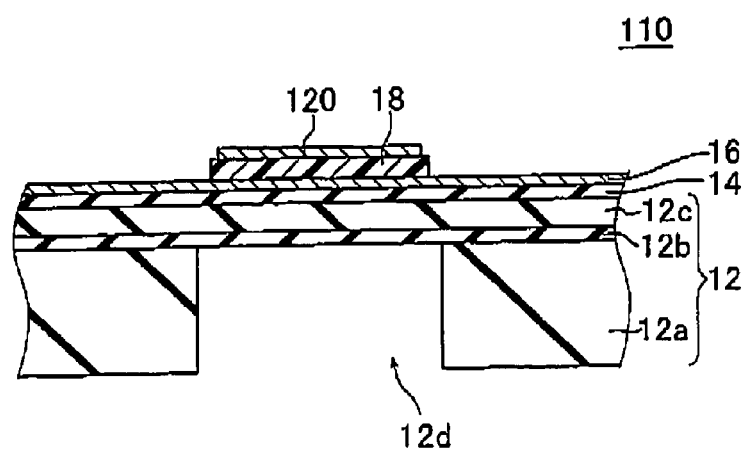
FIG. 6 is a sectional view showing schematically a comparative piezoelectric device.

A piezoelectric actuator of the type indicated by 110 in FIG. 6 was fabricated as a comparative sample. The piezoelectric actuator 110 was different from the sample of Example 1 in that it did not have the protective film 22 and that an upper electrode 120 consisted of a 10-nm Ti layer (adhesive layer) and a 200-nm thick Pt layer (electrically conductive layer) in place of the 200-nm thick Ir layer. Except for these differences, the piezoelectric actuator 110 was fabricated by the same procedure that is depicted in FIGS. 2A to 2E and in FIGS. 3A and 3B and which has been described above in detail.

The upper electrode 120 in the sample of Comparative Example 1 had a water vapor transmission rate of 10 $g/m^2/day$, so the comparative sample did not satisfy the requirement of the present invention that the water vapor transmission rate of the upper electrode should be not more than 1 $g/m^2/day$. This comparative sample of piezoelectric actuator was measured for the time-dependent change in electric capacity by the same method as used for the sample of Example 1. The result is shown in FIG. 5 with the label of "Comparative Example 1" together with the result for Example 1.

Comparative Example 2

A piezoelectric actuator of the type shown in FIG. 3B was fabricated as a comparative sample by the same procedure as depicted in FIGS. 2A to 2E and in FIGS. 3A and 3B. This comparative piezoelectric actuator was identical to the sample of Example 1 except that it did not have the protective film 22. This comparative piezoelectric actuator was subjected to a durability test for evaluating its moisture resistance by the same method as used in Example 1. The results of the durability test are shown in FIG. 5 with the label of "Comparative Example 2."

As already mentioned, the piezoelectric film deteriorates due to the ingress of moisture, and when it deteriorates, the electric capacity between electrodes drops. Hence, measured values of electric capacity between electrodes can be used to assess the time-dependent deterioration of the piezoelectric film.

The durability tests showed that the electric capacity of the sample of Comparative Example 1 began to drop in about 10 hours, indicating the onset of deterioration in the piezoelectric film. In Comparative Example 2, the electric capacity of the sample began to drop in about 100 hours, indicating the onset of deterioration in the piezoelectric film. From these test results, it can be seen that the time to the start of deterioration in the sample of Comparative Example 2 having the upper electrode with a water vapor transmission rate of 0.1 $g/m^2/day$ was longer by a factor of 10 than in the sample of Comparative Example 1 having the upper electrode with a water vapor transmission rate of 10 $g/m^2/day$; this indicates that an improvement in durability (service life) in a humid environment could be achieved by adjusting the water vapor transmission rate of the upper electrode in the sample of Comparative Example 2 to not more than 1.0 $g/m^2/day$.

In contrast, the piezoelectric actuator of Example 1 according to the present invention did not experience a drop in electric capacity even after the passage of 1000 hours. Thus, it can be seen that the piezoelectric actuator of Example 1 within the scope of the present invention, which had an upper electrode with a water vapor transmission rate of 0.1 $g/m^2/day$ ($\leq 1.0$ $g/m^2/day$) and which also had the protective SiN film, was markedly improved in durability to provide a practically feasible durability (service life).

It was also found that compared to the sample of Comparative Example 1 which had an upper electrode with a water vapor transmission rate of 10 $g/m^2/day$ and which did not have a protective SiN film, the piezoelectric actuator of Example 1 had the time to the start of deterioration extended by a factor of at least 100, indicating a marked improvement in durability.

What is claimed is:

1. A piezoelectric device comprising:
   a substrate;
   a first electrode deposited on said substrate;
   a piezoelectric film deposited on top of at least a part of said first electrode by vapor phase deposition;
   a second electrode that is deposited on said piezoelectric film and which contains at least one element selected from the group consisting of Ti, Ir, Ta, Pd, Ru, Rh, and Os, wherein the second electrode has a thickness of 100 to 1000 nm and a water vapor transmission rate of not more than 1 $g/m^2/day$; and
   at least one protective film that covers at least peripheries of said second electrode and said piezoelectric film and which has an opening in a position that corresponds to said piezoelectric film except the periphery thereof.

2. The piezoelectric device according to claim 1, wherein said protective film contains at least one member selected from the group consisting of SiN, $SiO_2$, SiON, $Al_2O_3$, $ZrO_2$, and diamond-like carbon.

3. The piezoelectric device according to claim 1, wherein said piezoelectric film is deposited by sputtering.

4. A liquid-ejecting head comprising a piezoelectric device, said piezoelectric device including:
   a substrate;
   a first electrode deposited on said substrate;
   a piezoelectric film deposited on top of at least a part of said first electrode by vapor phase deposition;
   a second electrode that is deposited on said piezoelectric film and which contains at least one element selected from the group consisting of Ti, Ir, Ta, Pd, Ru, Rh, and Os, wherein the second electrode has a thickness of 100 to 1000 nm and a water vapor transmission rate of not more than 1 $g/m^2/day$; and
   at least one protective film that covers at least peripheries of said second electrode and said piezoelectric film and which has an opening in a position that corresponds to said piezoelectric film except the periphery thereof.

5. The liquid-ejecting head according to claim 4, wherein said protective film contains at least one member selected from the group consisting of SiN, $SiO_2$, SiON, $Al_2O_3$, $ZrO_2$, and diamond-like carbon.

6. The liquid-ejecting head according to claim 4, wherein said piezoelectric film is deposited by sputtering.

7. The piezoelectric device according to claim 1, wherein said substrate comprises a silicon-on-insulator substrate member and a thermally oxidized film formed on a surface of said silicon-on-insulator substrate member, said first electrode being formed on said thermally oxidized film.

8. The piezoelectric device according to claim 7, wherein said silicon-on-insulator substrate member comprises a support layer made of silicon, a silicon oxide layer formed on said support layer, and an active layer made of silicon which is formed on said silicon oxide layer, said support layer having an opening formed in a position that corresponds to said piezoelectric film.

9. The liquid-ejecting head according to claim 4, wherein said substrate comprises a silicon-on-insulator substrate member, and a thermally oxidized film formed on a surface of said silicon-on-insulator substrate member, said first electrode being formed on said thermally oxidized film.

10. The liquid-ejecting head according to claim 9, wherein said silicon-on-insulator substrate member comprises a support layer made of silicon, a silicon oxide layer formed on said support layer, and an active layer made of silicon which is formed on said silicon oxide layer, said support layer having an opening formed in a position that corresponds to said piezoelectric film.

* * * * *